United States Patent
Pril et al.

(10) Patent No.: US 6,987,557 B2
(45) Date of Patent: Jan. 17, 2006

(54) ENHANCED LITHOGRAPHIC DISPLACEMENT MEASUREMENT SYSTEM

(75) Inventors: Wouter Onno Pril, Eindhoven (NL); Engelbertus Antonius F. Van De Pasch, Oirschot (NL); Robert F. Dillon, Stoneham, MA (US); Philip Dennis Henshaw, Carlisle, MA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/719,067

(22) Filed: Nov. 24, 2003

(65) Prior Publication Data

US 2004/0169837 A1 Sep. 2, 2004

Related U.S. Application Data

(60) Provisional application No. 60/429,314, filed on Nov. 27, 2002.

(51) Int. Cl.
*G03B 27/72* (2006.01)
*G03B 27/54* (2006.01)

(52) U.S. Cl. .......................................... 355/71; 355/67
(58) Field of Classification Search ............ 355/52–53, 355/55, 67–71; 356/399–401, 517; 250/548
See application file for complete search history.

(56) References Cited

U.S. PATENT DOCUMENTS

| | | | |
|---|---|---|---|
| 5,991,033 A | 11/1999 | Henshaw et al. | |
| 6,014,216 A | 1/2000 | Zorabedian | |
| 6,327,039 B1 * | 12/2001 | de Groot et al. | 356/517 |
| 6,583,856 B1 * | 6/2003 | Takahashi | 355/69 |
| 6,747,729 B2 * | 6/2004 | Pril et al. | 355/30 |
| 2002/0045113 A1 | 4/2002 | Pril et al. | |

\* cited by examiner

*Primary Examiner*—Henry Hung Nguyen
(74) *Attorney, Agent, or Firm*—Pillsbury Winthrop LLP

(57) ABSTRACT

Measurements of an interferometric measurement system are corrected for variations of atmospheric conditions such as pressure, temperature, and turbulence using measurements from a second harmonic interferometer (SHI). A ramp, representing the dependence of the SHI data on path length, is removed before utilizing the SHI data. The SHI may include a passive Q-switched laser as a light source and Brewster prisms in the receiver module. Optical fibers may be used to conduct light to the detectors. A mirror reflecting the measurement beams has a coating of a thickness selected to minimize the sensitivity of the SHI data to changes in coating thickness.

20 Claims, 3 Drawing Sheets

ENHANCED LITHOGRAPHIC DISPLACEMENT MEASUREMENT SYSTEM

This application claims priority from U.S. patent application Ser. No. 60/429,314, filed Nov. 27, 2002, herein incorporated by reference in its entirety.

BACKGROUND OF THE INVENTION

1. Field of the Invention

The present invention relates to lithographic projection apparatus and more particularly to position measurement systems employed therein.

2. Description of the Related Art

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as employed herein should be broadly interpreted as referring to a mechanism that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above.

In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus—commonly referred to as a wafer stepper—each target portion is irradiated by exposing the entire mask pattern onto the target portion in one go. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, typically, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, the pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus maybe of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithography apparatus, it is essential to keep an accurate track of the positions of the stages, e.g. a mask stage and a wafer stage, or other components, often in six degrees of freedom. To this end, interferometers are often used. In an interferometer used for position measurement, a measurement beam is reflected by a mirror attached to the target object and brought to interfere with a reference beam that travels an optical path of fixed length. Movements of the target object change the optical path length traversed by the measurement beam and so cause shifts in the interference fringes formed between it and the reference beam. The movements of the interference fringes are counted and used to calculate the movements of the target object. In a heterodyne interferometer, the Doppler shift of the fringes is measured. Highly accurate measurement of displacements of the target object can be achieved.

However, any disturbance of the atmosphere through which the measurement and reference beams pass that causes a change in the optical path length will introduce errors into the measured displacements. Such disturbances may be caused by, for example, changes in the air temperature or pressure, or by leaks of gases, e.g. gases such as He or N used to flush the projection beam path in apparatus using radiation that is strongly absorbed by air.

To maintain the accuracy of position measurements by interferometers, efforts have been taken to provide air showers that supply artificial air of known and constant composition, temperature, and pressure to the measurement and reference beam paths as well providing mechanical devices to reduce turbulence. Such arrangements have sufficed for interferometric displacement measuring systems capable of measuring displacements with an accuracy of the order of 10 nm. However, given the ever present demands to image ever smaller features with higher precision, it is desirable to be able to measure stage positions with even smaller error margins.

Because of the well-characterized dispersion of air, see for example M. E. Thomas and D. D. Duncan, "Atmospheric Transmission," in F. G. Smith, ed., The Infrared and Electro-Optical Systems Handbook, Volume 2 (U. Michigan Press, Ann Arbor, Mich.) 88, incorporated herein by reference, measurement of an optical path at two sufficiently separated wavelengths can allow the effects of pressure and temperature changes to be determined. The displacements measured by an interferometric displacement measuring system can then be corrected accordingly. A second harmonic interferometer to measure such effects has been proposed in F. A. Hopf, A. Tomita, and G. Al-Jumaily, "Second-harmonic interferometers," Opt. Lett. 5 (1980) 386. Interferometric displacement measuring devices making use of second harmonic interferometers have been described in U.S. Pat. Nos. 4,948,254, 5,404,222, 5,537,209, 5,543,914 and 5,991,033. However, practical difficulties in the implementation of a two color interferometer in a lithographic projection apparatus remain.

SUMMARY OF THE INVENTION

Systems, apparatus, and methods consistent with the principles of the present invention, as embodied and broadly described herein, provide for an enhanced displacement measuring system for use in a lithographic projection apparatus having increased accuracy, regardless of pressure and temperature disturbances in the optical paths of measurement and reference beams. One embodiment of the present invention comprises an interferometric measuring system configured to measure displacements of a target object being a component of said apparatus, a second harmonic interferometer configured to measure atmospheric conditions along an optical path, and a control system that is responsive to the second harmonic interferometer and configured to apply corrections to measurements of the interferometric measuring system. The control system is adapted to remove from measurements of the second harmonic interferometer any dependence on the length of the optical path before the measurements are used to apply corrections to measurements of the interferometric measuring system.

Having removed the linear dependence on path length, referred to as "ramp", it is possible to filter the second harmonic interferometer data to improve the signal to noise ratio and hence improve the accuracy of the compensation, without introducing harmful phase delays in the position measurement.

Conveniently, the control system is adapted to subtract from said measurements of said second harmonic interferometer an amount representing an expected linear dependence on said length of said optical path. In one embodiment, the control system corrects measurements of said interferometric measuring system using the formula:

$$L = \lambda_r N_r - K(\lambda_u N_u - P^* \lambda_r N_r), \text{ where}$$

$$P^* = \alpha_u - \alpha_g$$

$\lambda_{rv} = (1 + \alpha_r)\lambda_r$ is the vacuum wavelength of the measurement beams of the interferometric measuring system, $$K = \alpha_r / (\alpha_u - \alpha_g),$$

$\lambda_u$ is the short vacuum wavelength of the second harmonic interferometer, $N_u$ is the fringe count of the second harmonic interferometer, and $\alpha_r, \alpha_g, \alpha_u$ are the refractivities (refractive index −1) of air at the wavelength of measurement beams and the long and short wavelengths of the second harmonic interferometer, respectively.

Alternatively, the control system is adapted to divide said measurements of said second harmonic interferometer by an amount representing said length of said optical path.

Another aspect of the present invention provides that measurement beams of the interferometric measuring system and the second harmonic interferometer are directed against, and reflected by, the same mirror on the target object. The mirror on the target object includes a protective coating, having a nominal thickness, such that the sensitivity of measurements of said second harmonic interferometer to variations in the thickness of said coating is minimized.

In this way, the number of calibration points necessary to eliminate errors deriving from coating thickness variations can be substantially reduced and the tolerance on the coating thickness can be relaxed, without affecting accuracy of the overall compensation.

The nominal thickness T preferably meets one of the following criteria:

$$T = (50 \pm 10)\text{nm} + (p \times \lambda_u / n_{coating}),$$

$$T = (110 \pm 10)\text{nm} + (p \times \lambda_u / n_{coating}), \text{ or}$$

$$T = (170 \pm 20)\text{nm} + (p \times \lambda_u / n_{coating}), \text{ where}$$

p is a non-negative integer, $\lambda_u$ is the short vacuum wavelength of the second harmonic interferometer and $n_{coating}$ is the refractive index of the coating at $\lambda_u$.

For a coating of $SiO_2$, $\lambda_u/n_{coating}$=182 nm

A pulsed laser radiation source provides a high peak power so that a sufficiently high intensity of second harmonic radiation can be obtained from a second harmonic generation crystal, without the need for additional optics, such as focusing elements and reflectors to form a cavity. The signal to noise ratio can also be improved by locking measurements to the laser pulses. A preferred pulsed laser source is a passive Q-switched laser. Desirably, the pulsed laser source has a pulse repetition rate in the range of from 5 to 10 kHz. This is sufficiently high to adequately sample turbulence effects that would disturb the interferometric measuring system measurements.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
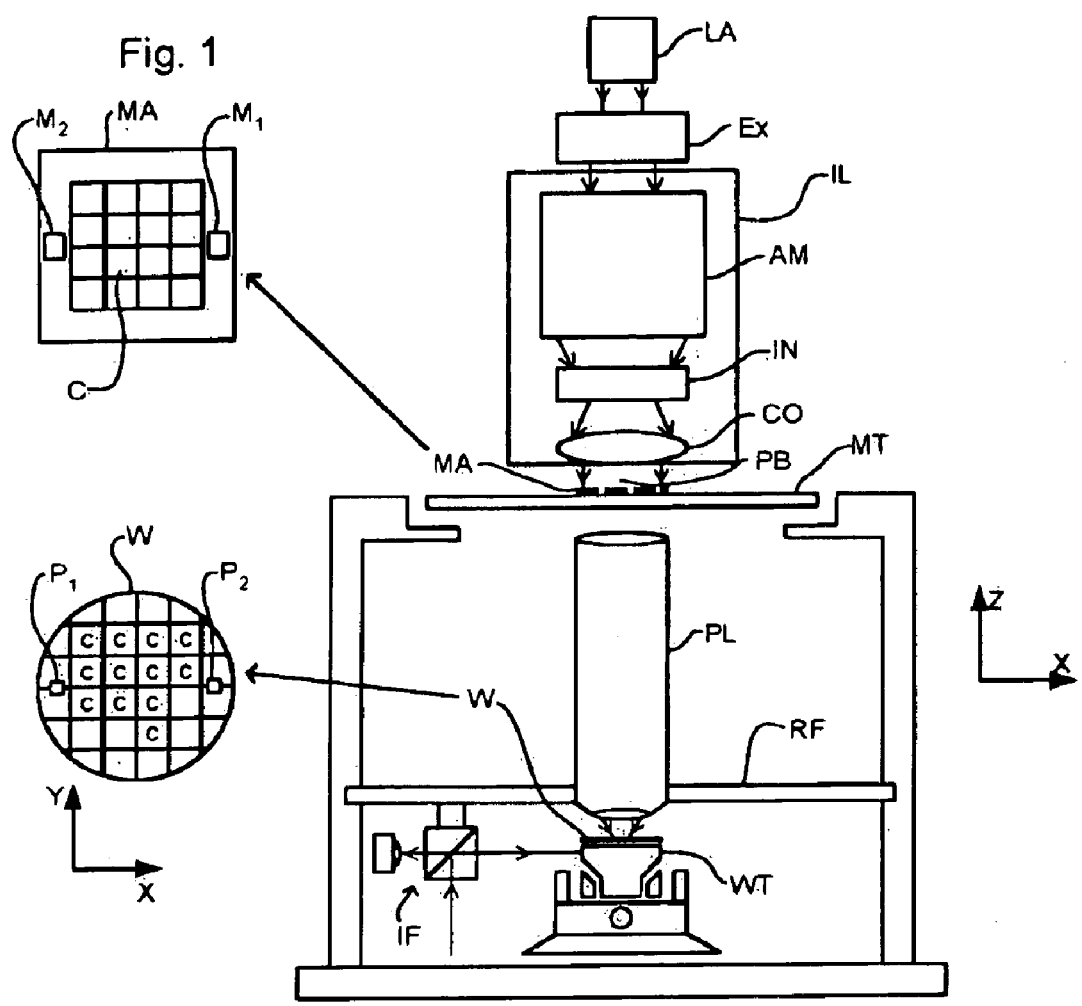
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL: for supplying a projection beam PB of radiation (e.g. UV radiation such as for example generated by an excimer laser operating at a wavelength of 248 nm, 193 nm or 157 nm, or by a laser-fired plasma source operating at 13.6 nm). In this particular case, the radiation system also comprises a radiation source LA;

a first object table (mask table) MT: provided with a mask holder for holding a mask MA (e.g. a reticle), and connected to first positioning mechanism PM for accurately positioning the mask with respect to item PL;

a second object table (substrate table or substrate holder) WT: provided with a substrate holder for holding a substrate W (e.g. a resist-coated silicon wafer), and connected to second positioning mechanism PW for accurately positioning the substrate with respect to item PL; and a projection system ("lens") PL: (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning mechanism, such as a programmable mirror array of a type as referred to above.

The source LA (e.g. a UV excimer laser, a laser-fired plasma source, a discharge source, or an undulator or wiggler provided around the path of an electron beam in a storage ring or synchrotron) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW (and interferometric measuring mechanism IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan.

In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:

step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

other mode: the mask table MT is kept essentially stationary holding a programmable patterning means, and the substrate table WT is moved or scanned while a pattern imparted to the projection beam is projected onto a target field C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable patterning means, such as a programmable mirror array of a type as referred to above.

Combinations and/or variations on the above described modes of use or entirely different modes of use may also be employed by lithographic apparatus.

First Embodiment

The performance of the interferometric measuring mechanism IF is directly related to the performance of the lithographic machine as a whole and in particular to its overlay performance—that is, the accuracy with which a process layer is aligned with previous layers. Local and global pressure and temperature changes affect the index of refraction of the air in the measurement path of the interferometric measuring mechanism IF. It will be appreciated that local pressure and temperature changes are sometimes referred to as "turbulence," even if they do not actually involve turbulent airflows.

Because of the well-characterized dispersion of air, measurements of the optical path length at two wavelengths can provide the information required to remove the effects of air turbulence and other variations in air density on the measured path length. Air is similar to most other materials in that the index of refraction increases as the wavelength of the measurement beam decreases. The refractivity (index of refraction minus one) shows the same proportional change at all wavelengths due to local or global pressure or temperature changes. In the same way, the difference in index of refraction for two wavelengths, such as 532 nm and 266 nm, will show a proportional change equal to the refractivity change at any other wavelength. (For these two wavelengths, the difference in index of refraction is approximately $18 \times 10^{-6}$.)

By comparing the optical path length seen by one wavelength to the optical path length seen by a different wavelength, the change of refractivity at any other wavelength and, therefore, the change in optical path length, can be inferred. According to this embodiment of the present invention, a direct measurement of the path length difference is made using second harmonic interferometry. A Second Harmonic Interferometer (SHI) makes use of frequency doubling at both the input and the output of the interferometer. Second harmonic interferometry provides a way to make an accurate comparison of the optical path length at two colors.

Figure 2:
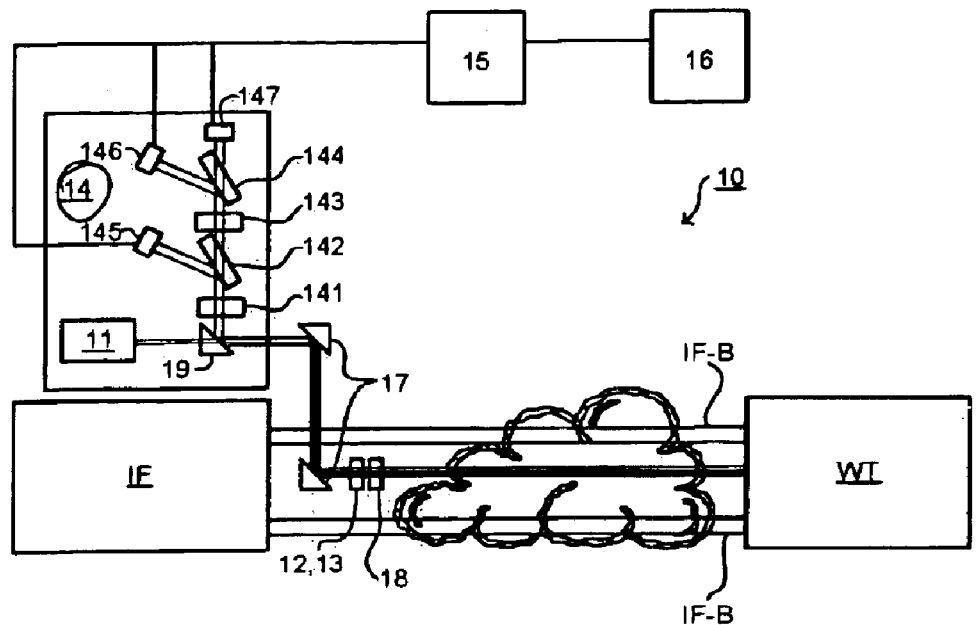
FIG. 2 is a block diagram of a second harmonic interferometer used in an embodiment of the present invention.

As depicted in FIG. 2, a second harmonic interferometer 10 is used in the present invention. A laser 11, e.g. a passive Q switched laser, provides a beam at a first wavelength, e.g. 532 nm. At the input to the optical path, an optical frequency doubler 12 converts some of the input beam to a beam phase locked to the input long wavelength beam and having half the wavelength (double the frequency). Thus, if the input long wavelength beam is 532 nm the short wavelength beam is 266 nm.

The two beams propagate over the identical path, but at two different colors. At the end of the path, a second doubler 13 is used to convert the light that traveled the path as a longer wavelength into the shorter wavelength. The two doublers 12, 13 provide two beams at the shorter wavelength, which can be compared in receiver 14 to determine the change in air density in the common optical path. This change in air density can be used to correct any other measurement wavelength (such as 633 nm) in the interferometric measuring system IF for atmospheric turbulence. The receiver 14 includes a dichroic mirror 19 to couple the short wavelength beam out of the optical path.

The detector modules are connected via a high bandwidth analog link to a demodulation unit 15 which in turn is connected to a processing unit, including analog to digital converters, via a low bandwidth analog link. The processing unit is connected to the digital control system 16 of the remainder of the apparatus via a high speed digital link.

A two pass configuration, with the second harmonic interferometer beam being reflected by a mirror mounted on the target object, is used so that a single thin, e.g. 1–4 mm, piece of β-Barium Borate or potassium dihydrogen phosphate serves as both the input and output beam doublers 12, 13. Small angular adjustments can be made to ensure phase matching of the long and short wavelength beams. This eliminates the need for an oven to maintain the doubler at a temperature above ambient.

Laser 11 is preferably a passive Q-switched laser providing a beam at 532 nm (possibly using a doubler in a beam at 1064 nm) and a pulse repetition rate of 5 to 10 kHz. This provides a very short high peak-power pulse that doubles efficiently into the UV, enabling the use of compact doublers whilst still ensuring a useful UV pulse energy. Passive Q-switching enables use of a compact, low-cost laser and pulse repetition rates that are much higher than variations in air turbulence and other disturbances that may affect the optical path length. A collimator, preferably a single lens, and a linear polarizer is provided in its output. To make the system as compact as possible, the laser gain medium and cavity are formed by a single monolithic optical element.

FIG. 2 shows the arrangement of the second harmonic interferometer 10 relative to interferometric displacement measuring system IF, which directs measurement beams IF-B against a mirror provided on the side of substrate table WT (often referred to as the mirror block). In principle, a second harmonic interferometer should be provided for each measurement beam and reference beam of the interferometric displacement measuring system IF. However, for certain embodiments, the second harmonic interferometer may be omitted for measurement beams that are sufficiently short and/or protected from turbulence and where two or more measurement beams are close together, one second harmonic interferometer may provide corrections for two or more measurement axes. Second harmonic interferometers are generally not needed for the reference beams because these are generally short and well protected from turbulence.

As can be seen, a module containing the laser 11 and receiver 14 is positioned adjacent the interferometric displacement measuring system IF and mirrors 17 couple the second harmonic interferometer beams to and from a path adjacent the path of the measurement beams IF-B. Between the nonlinear optical crystal functioning as doublers 12, 13 and the stage mirror is a two-frequency waveplate 18. This introduces a quarter-wave retardation at the short wavelength and a full-wave or (zero) retardation at the longer wavelength, so that two cross-polarized beams at the short wavelength are produced.

In the receiver module 14, the polarizations of the incident, cross-polarized 266 nm beams are rotated by a half-wave plate 141 so that the planes of polarization are at ±45° to the principal plane of Brewster plates (prisms) 142, 144. The reflection from the first Brewster prism 142 consists of equal, S-polarized fractions of each 266 nm beam. These two beams form an interference signal at first detector 145.

The transmitted beam, however, contains both S and P polarized light. This transmitted beam emerges from the first Brewster prism 142 normal to the second surface of the prism. A quarter-wave plate 143 between the two Brewster prisms 142, 144 adds a 90° phase shift to the first 266 nm beam relative to the second 266 nm beam. Additional S-polarized light is reflected from the second Brewster prism 144 onto second detector 146, where an interference signal is detected. This second signal is out of phase with the first interference signal. The remainder is transmitted through the first surface and onto third detector 147. The beam transmitted through the Brewster prisms onto third detector 147 is primarily P-polarized. This third beam will interfere with a phase that is again different from the phases at detectors 145 and 146.

In the above arrangements, the first surface of each of the Brewster Prisms is oriented at Brewster's angle but the second surface need not be—it may also be normal to the beam.

The three detected signals will trace out an elliptical path in three-dimensional space as the amount of air in the measurement path varies. Using a simple calibration sequence discussed below, the three detected signals from this receiver allow the phase delay induced by the atmosphere to be calculated in real time, on a pulse by pulse basis. The use of three interference signals allows the phase delay to be calculated independent of the intensity of the first and second UV beams.

The phase measured by the second harmonic interferometer is directly proportional to the amount of air in the measurement path. The phase changes due to turbulence in the path, global pressure or temperature changes, and changes in the physical path length.

Because the three channel measurements are samples of sinusoids, they are periodic. Because the second harmonic interferometer phase can change by many multiples of $2\pi$ as the physical path length changes, a counter is required to track the current value of the phase.

The gain, modulation depth, and relative phase of each of the three measurements depend on the receiver set up. These values can be determined for each receiver using a calibration sequence. Moving the stage through a small distance sweeps the second harmonic interferometer phase through $2\pi$. The recorded values in each measurement channel can be processed to yield the relative gain, modulation depth, and phase of each channel. This information is used to determine a 3×3 matrix transformation and an offset vector. These two quantities map the calibration data onto a unit circle centered at the origin.

During operation, the 3×3 matrix transformation and offset vector determined during calibration are applied to the three detected signals corresponding to a single laser pulse. This single transformation puts the received data into a "unit circle" space, and the second harmonic interferometer phase is easily calculated using an inverse tangent. Fading of the signals does not affect the calculated phase. Fading simply moves the transformed data toward or away from the origin in this space, and this movement does not affect the result of the inverse tangent calculation.

The calibration should be redone when the system temperature and/or the optics alignment may have changed. The period between re-calibration will depend on the temperature control in the stage area.

Both the interferometric displacement measuring system IF and the second harmonic interferometer count fringes. In the prior art, the interferometric displacement measuring system fringe count is multiplied by an estimate of the laser wavelength in air to determine the length of a path (as it would be measured in vacuum), as follows:

$$L = \lambda_r N_r, \text{ where}$$

$\lambda_r$ is the wavelength of the measurement beams IF-B in air, and $N_r$ is the fringe count in air.

This path length estimate is only approximate because it uses a value for the wavelength in air obtained from a sensor used to measure the properties of the air that is not located close to the measurement path and because the estimates are updated at a rate lower than the turbulence bandwidth.

In embodiments of the present invention, the interferometric displacement measuring device fringe count is used to calculate the optical path length in air by using the vacuum wavelength of the measurement beams IF-B to multiply the fringe count in air. The second harmonic interferometer can then be used to produce a better estimate of the optical path length in vacuum by subtracting a real-time measurement of the amount of air in the path of the measurement beans IF-B, as follows:

$$L = \lambda_{rv} N_r - K \lambda_u N_u, \text{ where} \tag{1}$$

$\lambda_{rv} = (1+\alpha_r)\lambda_r$ is the vacuum wavelength of the measurement beams IF-B, $K = \alpha_r/(\alpha_u - \alpha_g)$ is a coefficient multiplying the second harmonic interferometer system (NB. K is to a good approximation insensitive to pressure and temperature), $\lambda_u$ is the wavelength of the second harmonic interferometer, $N_u$ is the fringe count of the second harmonic interferometer, and $\alpha_r$, $\alpha_g$, $\alpha_u$ are the refractivities of air at the wavelength of measurement beams IF-B and the long and short wavelengths of the second harmonic interferometer, respectively.

Each term in equation (1) contains a "ramp," defined as the effect of air on the optical path length. The effects of this ramp can be removed from both terms. As long as the same ramp is removed from both terms, no errors will be introduced by this ramp removal.

$$L = \lambda_r N_r - K(\lambda_u N_u - P^* \lambda_r N_r), \text{ where} \tag{2}$$

$P^* = \alpha_u - \alpha_g$ is a "ramp-removal coefficient" determined by the properties of the air at the wavelengths of the second harmonic interferometer.

The advantage of this ramp removal is that the data from the second harmonic interferometer can be low-pass filtered to improve the signal to noise ratio, and the resulting turbulence signal can be sent to the stage motion control system without significant errors due to data latency. In addition, because the turbulence term (the second term in equation (2) above) is small (10 nm or less), small errors in the coefficient K will have very little effect on the measured turbulence.

To avoid introducing errors, the information used to determine K, $\lambda_r$, and $P^* = \alpha_u - \alpha_g$ should be consistent. This means that the coefficients should be updated at the same time, and consistent information should be used to perform this update. The coefficients may be updated from data provided by temperature, pressure and humidity sensors or from data provided by the interferometric displacement measuring system IF or the second harmonic interferometer 10.

The atmospheric phenomena that affect the second harmonic interferometer phase can occur on different time scales. Global pressure and temperature changes can occur over periods of hours. Smaller "global" pressure changes, induced by events in the tool or in the fab, can occur in a fraction of a second. Turbulence on a local scale occurs primarily below a frequency of 10 Hz (depending on air flow). Changes in the length of the air column due to stage motion are faster than turbulence and can have sharp discontinuities at the ends of scans.

The limited bandwidth of turbulence provides an opportunity to increase substantially the accuracy of the second harmonic interferometer by filtering the second harmonic interferometer data that is obtained at the laser pulse repetition frequency (approximately 5 kHz). However, filtering the rapid changes in second harmonic interferometer phase due to stage motion can introduce errors. The effect of stage motion is removed by using stage motion information from the interferometric displacement measuring system IF. Stage position at the time of the passive Q-switched laser pulse can be determined to the necessary accuracy by interpolating the stage position.

As shown in FIG. 2, the beams of both the interferometric displacement measuring system IF and the second harmonic interferometer 10 are directed against a mirror provided on the side of the target object which, in this embodiment, is the substrate holder (i.e., wafer table). Since the accuracy of the interferometric measuring system IF is strongly dependent on the flatness of this mirror—non-flatness may induce cross-talk between the degrees of freedom—the mirror is formed by metallizing the side of the table, which is made of Zerodur or a similar material and machined to a high degree of flatness. Any residual unflatness is mapped and compensated for in the calculation of table position. To protect the metallization from oxidation and physical damage (e.g. scratching), it is necessary to provide a coating of, for example, $SiO_2$ or MgF and a thickness of several hundred nm.

Figure 3:
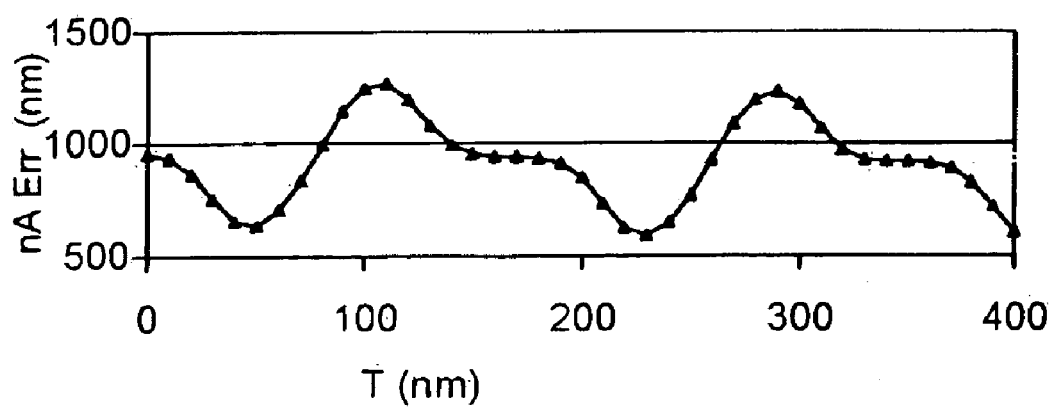
FIG. 3 is a graph of errors in the compensation as a function of coating thickness on a mirror in the interferometric displacement measuring system.

The coating, because of the different refractivities of the coating material at the long and short wavelengths employed in the second harmonic interferometer, introduces different phase delays in the long and short wavelength beams of the second harmonic interferometer. The phase difference appears, if not taken account of, as a substantial error in the optical path length measured by the second harmonic interferometer. This error is shown in FIG. 3 as a function of the coating thickness for an $SiO_2$ coating.

If the coating thickness were constant across the entire area of the mirror, then correcting for it would be a simple matter of subtracting a constant value from the output of the second harmonic interferometer. However, FIG. 3 shows that even small variations in the coating thickness result in large errors in the output of the second harmonic interferometer. A thickness variation of even 1 nm can lead to an error of 10 nm. According to one embodiment of the invention, the nominal coating thickness is selected to be in a region where the sensitivity of the second harmonic interferometer to coating thickness is low, preferably zero. As can be seen, there are several thickness ranges which repeat with a period of about 180 nm, of an $SiO_2$ coating, satisfying such a criteria. These are thicknesses of about 50, 110 or 170 (+n×180) nm, where n is an non-negative integer. A nominal thickness of 170+n×180 nm is preferred because the range of thicknesses for which the sensitivity to thickness variations is low is largest.

It will be appreciated that suitable nominal thickness ranges for other coating materials can be determined empirically or by simulation.

The selection of a nominal thickness at which the sensitivity to thickness variations is low can be combined with a calibration or mapping of the thickness variations and a compensation via a look-up table, as is performed in the interferometric measuring mechanism IF for mirror unflatness.

As mentioned above, the efficiency of short wavelength generation of the doublers 12, 13 is sensitive to their angle relative to the input beam. This is because the non-linear crystals used in the doublers have different refractive indices parallel and perpendicular to their optical axis. The doublers are set at an angle such that their refractive indices at the long and short wavelengths are equal so that the long and short wavelength beams propagate in phase avoiding destructive interference between the short wavelength radiation generated at different positions in the non-linear crystal.

Figure 4:
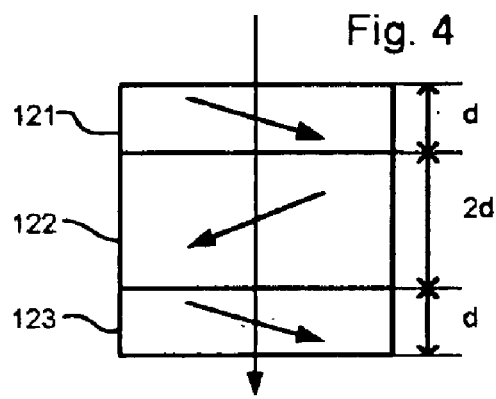
FIG. 4 is a diagram of optical components in a compensated interferometric displacement measuring system used in a second embodiment of the present invention.

According to one embodiment of the invention, the optical doubler is formed of a stack of non-linear crystals with adjacent crystals rotated by 180° around the direction of the incident radiation, as shown in FIG. 4. Such a stack reduces the angle sensitivity of the doubler and a stack of three crystals with the middle crystal having a thickness twice the thickness of the two outer crystals, as shown, can theoretically provide complete angle insensitivity. A similar effect can be obtained with a stack of many crystals of equal thickness.

Angle sensitivity may alternatively or in addition be corrected for in software or by active beam steering. The problem can be minimized by using a non-linear crystal, such as KD*P, having a phase matching angle close to 90°.

Second Embodiment

Figure 5:
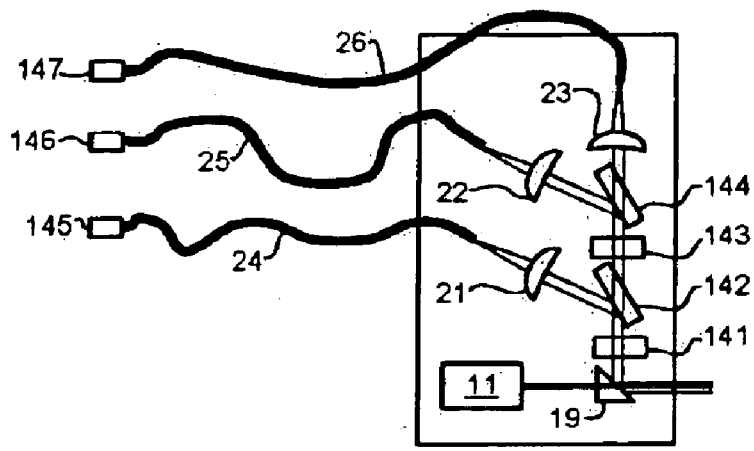
FIG. 5 is a diagram of an arrangement for spatially combining beams of the interferometric displacement measuring system and the second harmonic interferometer in a third embodiment of the invention.

A second embodiment of the invention uses optical fibers to conduct light to detectors located remotely and is the same as the first embodiment save as described below, with reference to FIG. 5.

The second embodiment addresses the problem that the photodetectors used to measure the intensity of the interference patterns between the two beams of the second harmonic interferometer have different characteristics across their surfaces. Thus, their outputs will vary if the position of the beam varies. Such position variation may occur because of unflatness in the mirror on the target object, which causes variation in the angle of the returned beams, and hence the position of the interfered beams on the detectors, particularly where the beam diameters are small. In the second embodiment, the detectors 145–147 are placed remotely and the interfered beams conducted to them via optical fibers 24–26. Lenses 21–23 are provided to couple the interfered beams into the optical fibers 24–26.

Third Embodiment

In a third embodiment of the invention, which is the same as the first or the second embodiment save as described below, a 45° mirror is used to spatially combine the beams of the interferometric displacement measuring system and the second harmonic interferometer. The second harmonic interferometer can most accurately correct the interferometric measuring system if the various beams traverse exactly the same optical path, in the region subject to disturbances.

The beams are combined using a dichroic mirror that transmits the interferometer beams IF-B but reflects the second harmonic beams, both long and short wavelength beams. In the past, a dichroic mirror oriented at close to normal to the interferometer beams IF-B has been used to minimize the disturbance to the polarization state of the various beams. However, this arrangement occupies a relatively large volume, which is inconvenient.

Figure 6:
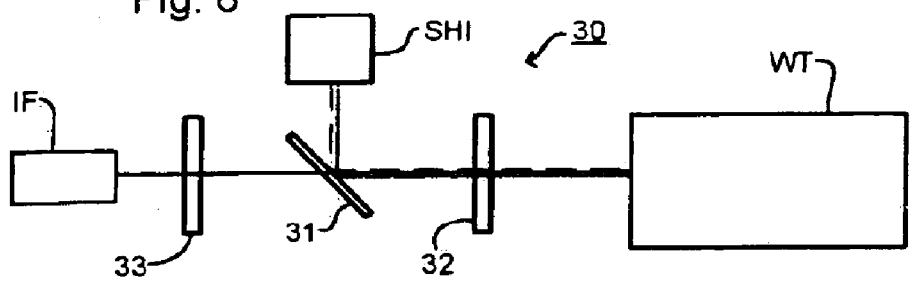
FIG. 6 is a diagram of another arrangement for spatially combining beams of the interferometric displacement measuring system and the second harmonic interferometer in a variant of the third embodiment of the invention.

According to this embodiment, a beam combiner 30, shown in FIG. 6, comprises a dichroic mirror 31 oriented at 45° to the interferometer beam IF-B for combining the three beams, a three-color wave plate 32 in the combined beam path and a quarter-wave plate 33 in the path of the interferometer beam path IF-B. The quarter-wave plate 33 converts the circularly polarized light emitted by the interferometer IF to be linearly polarized at S or P orientations when traversing the dichroic mirror. The three-color wave plate 32 is a half-wave plate to the long wavelength beam of the second harmonic interferometer and a quarter-wave plate to the short wavelength beam of the second harmonic interferometer and the interferometer beam IF-B. The three-color wave plate ensures that the returning beams reflected by the mirror on the target are also solely P or S polarized.

The three-color wave plate need only be exact at the wavelength of the short wavelength beam of the second harmonic interferometer—some divergence from the exact thickness can be tolerated at the other wavelengths. A slight offset at the long wavelength of the second harmonic interferometer will cause a gain in efficiency of the doubler on the second pass therethrough but no measurement errors. A slight offset at the wavelength of the interferometer beam IF-B will cause some intensity loss but again no measurement errors. A suitable three-color wave plate can be made of quartz or MgF.

The quarter-wave plate 33 may be omitted if the interferometric measuring system IF emits a linearly polarized beam, which may be arranged by omitting a quarter-wave plate in the output of the interferometer.

Figure 7:
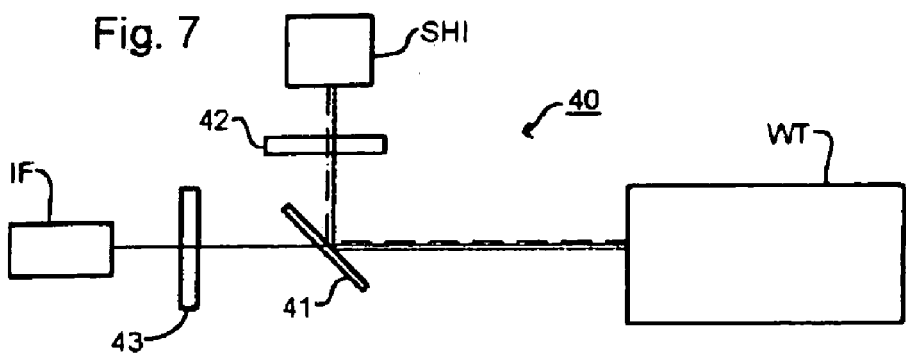
FIG. 7 shows an alternative of the arrangement according to FIG. 6.

A variant beam combiner 40 is shown in FIG. 7. In place of the three-color wave plate in the combined beam path and the quarter-wave plate in the interferometer beam path, two corrective wave plates 42, 43 are used.

Wave plate 42 is positioned in the path between the second harmonic interferometer SHI and the dichroic mirror 41 and imparts close to 0 retardation in the long wavelength beam and $\frac{1}{4}\lambda + \phi_1$ retardation in the short wavelength beam. Wave plate 43 is positioned in the path if the interferometer beam IF-B and imparts a $\frac{1}{4}\lambda + \phi_2$ retardation. $\phi_1$ and $\phi_2$ are correction retardations determined for the coating on the dichroic mirror.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures. For example, as described above a second harmonic interferometer is used to correct the output of an interferometric displacement measuring system for variations in temperature, pressure, humidity and turbulence ("weather"). However, a second harmonic interferometer as described may also be used as a temperature, pressure, etc. sensor independently and/or remotely of an interferometric displacement measuring system. Moreover, where a $1/p\lambda$ wave plate is employed, it is of course possible to employ a $(1/p+q/2)\lambda$ wave plate, where q is a positive integer.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic projection apparatus comprising:
   a radiation system configured to provide a beam of radiation;
   a support structure to support a patterning device configured to pattern the beam of radiation according to a desired pattern;
   a substrate holder to hold a substrate;
   a projection system configured to project the patterned beam onto a target portion of the substrate;
   an interferometric measuring system configured to measure displacement of a target object, said target object being a displaceable component of said apparatus;
   a second harmonic interferometer configured to measure atmospheric conditions along an optical path; and
   a control system responsive to said second harmonic interferometer and configured to apply corrections to measurements of said interferometric measuring system;
   wherein said control system is configured to remove from measurements of said second harmonic interferometer any dependence on the length of said optical path before said measurements are used to apply corrections to measurements of said interferometric measuring system.

2. The apparatus according to claim 1 wherein said control system corrects measurements of said interferometric measuring system using the formula:

$$L = \lambda_r N_r - K(\lambda_u N_u - P^* \lambda_r N_r)$$

where $$P^* = \alpha_u - \alpha_g$$

$\lambda_{rv} = (1+\alpha_r)\lambda_r$ represents a vacuum wavelength of the measurement beams of said interferometric measuring system, $$K = \alpha_r/(\alpha_u - \alpha_g),$$

$\lambda_u$ represents a short vacuum wavelength of the second harmonic interferometer, $N_u$ represents a fringe count of the second harmonic interferometer, and $\alpha_r$, $\alpha_g$, $\alpha_u$ represents the refractivities of air at the wavelength of measurement beams and the long and short wavelengths of the second harmonic interferometer, respectively.

3. The apparatus according to claim 1, wherein said control system is adapted to divide said measurements of said second harmonic interferometer by an amount representing said length of said optical path.

4. The apparatus according to claim 1, wherein said target object comprises said substrate holder.

5. A lithographic projection apparatus comprising:
   a radiation system configured to provide a beam of radiation;

a support structure to support a patterning device configured to pattern the beam of radiation according to a desired pattern;

a substrate holder to hold a substrate;

a projection system configured to project the patterned beam onto a target portion of the substrate;

an interferometric measuring system configured to measure displacement of a target object, said target object being a displaceable component of said apparatus;

a second harmonic interferometer configured to measure atmospheric conditions along an optical path;

a control system responsive to said second harmonic interferometer configured to apply corrections to measurements of said interferometric measuring system;

wherein measurement beams of said interferometric measuring system and said second harmonic interferometer are directed against and reflected by a same mirror on said target object; and wherein said mirror on said target object is provided with a protective coating having a nominal thickness such that the sensitivity of measurements of said second harmonic interferometer to variations in the thickness of said coating is minimized.

6. The apparatus according to claim 5, wherein said nominal thickness T meets one of the following criteria:

$$T=(50\pm10)\ \mathrm{nm}+(p\times\lambda_u/n_{coating}),$$

$$T=(110\pm10)\ \mathrm{nm}+(p\times\lambda_u/n_{coating}),\ \mathrm{or}$$

$$T=(170\pm20)\ \mathrm{nm}+(p\times\lambda_u/n_{coating})$$

where p is a non-negative integer, $\lambda_u$ is the short vacuum wavelength of the second harmonic interferometer and $n_{coating}$ is the refractive index of the coating at $\lambda_u$.

7. The apparatus according to claim 5, wherein said coating is formed of $SiO_2$.

8. The apparatus according to claim 5, wherein said target object comprises said substrate holder.

9. A lithographic projection apparatus comprising:

a radiation system configured to provide a beam of radiation;

a support structure to support a patterning device configured to pattern the beam of radiation according to a desired pattern;

a substrate holder to hold a substrate;

a projection system configured to project the patterned beam onto a target portion of the substrate;

an interferometric measuring system configured to measure displacement of a target object, said target object being a displaceable component of said apparatus;

a second harmonic interferometer configured to measure atmospheric conditions along an optical path;

a control system responsive to said second harmonic interferometer and configured to apply corrections to measurements of said interferometric measuring system;

wherein said second harmonic interferometer comprises:
a first Brewster prism to receive the beams of said second harmonic interferometer;
a first detector to receive radiation reflected by said first Brewster prism;
a quarter-wave plate configured to introduce a 90° phase shift between two beams transmitted by said first Brewster prism;
a second Brewster prism to receive beams that have traversed said quarter-wave plate;
a second detector to receive beams reflected by said second Brewster prism; and
a third detector to receive beams transmitted by said second Brewster prism.

10. The apparatus according to claim 9, wherein said target object comprises said substrate holder.

11. The apparatus according to claim 9, wherein said first Brewster prism for receiving the beams of said second harmonic interferometer has a principal plane at ±45° to the polarizations thereto.

12. The apparatus according to claim 9, wherein said beams reflected by said first Brewster prism and reflected and transmitted by said second Brewster prism are conducted to the respective ones of said first, second, and third detectors by optical fibers.

13. The apparatus according to claim 9 wherein said second harmonic interferometer further comprises a half-wave plate to rotate the planes of polarization of two cross-polarized beams that have traversed said optical path and located before the first Brewster prism.

14. A lithographic projection apparatus comprising:

a radiation system configured to provide a beam of radiation;

a support structure to support a patterning device configured to pattern the beam of radiation according to a desired pattern;

a substrate holder to hold a substrate;

a projection system to hold the patterned beam onto a target portion of the substrate;

an interferometric measuring system employing an interferometric measuring beam to measure displacement of a target object, said target object being a displaceable component of said apparatus;

a second harmonic interferometer employing second harmonic interferometer measuring beams to measure atmospheric conditions along an optical path;

a control system responsive to said second harmonic interferometer and configured to apply corrections to measurements of said interferometric measuring system; and a beam combiner for spatially combining said interferometric measuring beam and said second harmonic interferometer measuring beams;

wherein said beam combiner comprises:
a dichroic mirror configured to transmit said interferometric measuring beam and reflecting said second harmonic interferometer measuring beams and oriented at 45° to said interferometric measuring beam; and
a wave plate to ensure that the polarization of the beams reflected and transmitted by the dichroic mirror are purely S or P polarized.

15. The apparatus according to claim 14, wherein said target object comprises said substrate holder.

16. The apparatus according to claim 14, wherein said wave plate is a half-wave plate to the long wavelength one of said second harmonic interferometer beams and a quarter wave plate to the short wavelength one of said second harmonic interferometer beams and said interferometric measuring beam, said wave plate being positioned between said dichroic mirror and said target object.

17. The apparatus according to claim 16, wherein said beam combiner further comprises a quarter wave plate to change the polarization of the beam going from said interferometric displacement measuring system towards said target object from circular to linear and for changing the polarization of the returning beam from linear to circular.

18. A lithographic projection apparatus comprising:
- a radiation system configured to provide a beam of radiation;
- a support structure to support a patterning device configured to pattern the beam of radiation according to a desired pattern;
- a substrate holder to hold a substrate;
- a projection system configured to project the patterned beam onto a target portion of the substrate;
- an interferometric measuring system using an interferometric measuring beam to measure displacement of a target object, said target object being a displaceable component of said apparatus;
- a second harmonic interferometer using second harmonic interferometer to measure beams for measuring atmospheric conditions along an optical path;
- a control system responsive to said second harmonic interferometer configured to apply corrections to measurements of said interferometric measuring system; and
- a beam combiner to spatially combine said interferometric measuring beam and said second harmonic interferometer measuring beams;

wherein said beam combiner comprises:
- a dichroic mirror for transmitting said interferometric measuring beam and reflecting said second harmonic interferometer measuring beams; and
- first and second wave plates respectively located between the interferometric measuring and said dichroic mirror and between said second harmonic interferometer and said dichroic mirror for correcting the polarization of the beams reflected and transmitted by the dichroic mirror.

19. The lithographic projection apparatus according to claim 18, wherein said dichroic mirror is arranged for transmitting said interferometric measuring beam and reflecting said second harmonic interferometer measuring beams and oriented at 45° to said interferometric measuring beam.

20. A device manufacturing method, comprising:
- providing a substrate that is at least partially covered by a layer of radiation-sensitive material;
- projecting a patterned beam of radiation onto a target portion of the layer of radiation-sensitive material;
- measuring displacement of a target object using an interferometric displacement measuring system;
- measuring atmospheric conditions along an optical path; and
- correcting measurements of said interferometric displacement measuring system responsive to measurements of said atmospheric conditions; and
- removing from said measurements of atmospheric conditions any dependence on the length of said optical path before correcting measurements of said interferometric displacement measuring system.

* * * * *